(12) United States Patent
Reinke

(10) Patent No.: US 10,866,258 B2
(45) Date of Patent: Dec. 15, 2020

(54) IN-PLANE TRANSLATIONAL VIBRATING BEAM ACCELEROMETER WITH MECHANICAL ISOLATION AND 4-FOLD SYMMETRY

(71) Applicant: Honeywell International Inc., Morris Plains, NJ (US)

(72) Inventor: John Reinke, Plymouth, MN (US)

(73) Assignee: Honeywell International Inc., Charlotte, NC (US)

( * ) Notice: Subject to any disclaimer, the term of this patent is extended or adjusted under 35 U.S.C. 154(b) by 277 days.

(21) Appl. No.: 16/041,187

(22) Filed: Jul. 20, 2018

(65) Prior Publication Data

US 2020/0025790 A1 Jan. 23, 2020

(51) Int. Cl.
| | |
|---|---|
| G01P 15/08 | (2006.01) |
| G01P 15/03 | (2006.01) |
| H03H 9/24 | (2006.01) |
| G01P 15/097 | (2006.01) |
| H01L 41/083 | (2006.01) |
| G01L 1/16 | (2006.01) |

(52) U.S. Cl.
CPC ............ *G01P 15/032* (2013.01); *G01L 1/162* (2013.01); *G01P 15/097* (2013.01); *H01L 41/083* (2013.01); *H03H 9/2473* (2013.01); *B81B 2201/0235* (2013.01)

(58) Field of Classification Search
CPC ............ G01P 15/125; G01P 2015/0811; G01P 2015/0814
See application file for complete search history.

(56) References Cited

U.S. PATENT DOCUMENTS

| | | | | |
|---|---|---|---|---|
| 5,025,346 | A | * | 6/1991 | Tang ..................... B81B 3/0021 361/283.1 |
| 5,336,854 | A | * | 8/1994 | Johnson ............... G01G 3/1412 177/210 FP |
| 6,230,563 | B1 | | 5/2001 | Clark et al. |
| 6,269,696 | B1 | | 8/2001 | Weinberg et al. |
| 6,311,556 | B1 | | 11/2001 | Lefort et al. |
| 6,843,126 | B2 | * | 1/2005 | Hulsing, II ............. F02G 1/044 73/504.04 |
| 6,860,151 | B2 | | 3/2005 | Platt et al. |
| 7,124,633 | B2 | | 10/2006 | Quer et al. |
| 7,243,542 | B2 | | 7/2007 | Hulsing, II |
| 8,020,443 | B2 | | 9/2011 | Lin et al. |

(Continued)

OTHER PUBLICATIONS

Seshia, et al., "A Vacuum Packaged Surface Micromachined Resonant Accelerometer," Journal of Microelectromechanical Systems, vol. 11, No. 6, Dec. 2002, pp. 784-793.

*Primary Examiner* — Alexander A Mercado
(74) *Attorney, Agent, or Firm* — Shumaker & Sieffert, P.A.

(57) ABSTRACT

A vibrating beam accelerometer (VBA) with an in-plane translational proof mass that may include at least two or more resonators and be built with planar geometry, discrete lever arms, four-fold symmetry and a single primary mechanical anchor between the support base and the VBA. In some examples, the VBA of this disclosure may be built according to a micro-electromechanical systems (MEMS) fabrication process. Use of a single primary mechanical anchor may minimize bias errors that can be caused by external mechanical forces applied to the circuit board, package, and/or substrate that contains the accelerometer mechanism.

20 Claims, 6 Drawing Sheets

(56) References Cited

U.S. PATENT DOCUMENTS

| | | |
|---|---|---|
| 8,136,401 B2 | 3/2012 | Hentz et al. |
| 8,146,424 B2 | 4/2012 | Johnson et al. |
| 8,365,596 B2 | 2/2013 | Dwyer et al. |
| 8,434,364 B2 | 5/2013 | Cazzaniga et al. |
| 8,468,887 B2 | 6/2013 | McNeil et al. |
| 8,499,629 B2 | 8/2013 | Ballas et al. |
| 8,973,439 B1 | 3/2015 | Baldasarre et al. |
| 9,246,017 B2 | 1/2016 | van der Heide et al. |
| 9,354,246 B2 | 5/2016 | Simoni et al. |
| 9,733,269 B2 | 8/2017 | Hsu et al. |
| 9,856,133 B2 | 1/2018 | Boillot et al. |
| 2002/0051258 A1* | 5/2002 | Tamura ............... G01P 15/0802 358/514 |
| 2003/0196489 A1* | 10/2003 | Dwyer ............... B81C 99/0065 73/497 |
| 2014/0083190 A1* | 3/2014 | Kaack ............... G01P 15/135 73/514.14 |
| 2016/0097789 A1* | 4/2016 | Clark ............... G01P 15/02 73/514.01 |
| 2016/0139171 A1* | 5/2016 | Becka ............... G01P 15/032 73/514.29 |
| 2016/0282382 A1* | 9/2016 | Jeanroy ............... G01P 15/097 |
| 2016/0349283 A1* | 12/2016 | Bramhavar ............ G01P 15/093 |
| 2018/0031601 A1* | 2/2018 | Anac ............... B81B 7/008 |
| 2018/0275161 A1* | 9/2018 | Tang ............... G01P 15/18 |
| 2020/0025792 A1* | 1/2020 | Reinke ............... B81B 7/007 |

\* cited by examiner

IN-PLANE TRANSLATIONAL VIBRATING BEAM ACCELEROMETER WITH MECHANICAL ISOLATION AND 4-FOLD SYMMETRY

STATEMENT REGARDING FEDERALLY SPONSORED RESEARCH OR DEVELOPMENT

This invention was made with Government support under Government Contract # HR0011-16-9-0001 awarded by DARPA. The Government has certain rights in the invention.

TECHNICAL FIELD

The disclosure relates to vibrating beam accelerometers.

BACKGROUND

Accelerometers function by detecting a displacement of a proof mass under inertial forces. In one example, an accelerometer may detect the displacement of a proof mass by the change in frequency of a resonator connected between the proof mass and a support base. A resonator, which may be designed to change frequency proportional to the load applied to the resonator by the proof mass under acceleration. The resonator may be electrically coupled to an oscillator, or other signal generation circuit, which causes the resonator to vibrate at its resonant frequency.

SUMMARY

In general, the disclosure is directed to a vibrating beam accelerometer (VBA) with an in-plane translational proof mass. For example, a VBA configured in accordance with the techniques of this disclosure may include at least one or more resonators, planar geometry, discrete lever arms, four-fold symmetry and a single primary mechanical anchor between the support base and the VBA. In some examples, the VBA of this disclosure may be built according to a micro-electromechanical systems (MEMS) fabrication process.

Use of a single primary mechanical anchor may minimize bias errors that can be caused by external mechanical forces applied to the circuit board, package, and/or substrate that contains the accelerometer mechanism. The source of external forces may be unavoidable, for example, thermal expansion mismatch between the substrate (e.g. the support base) and the VBA mechanism. The single primary mechanical anchor may mechanically isolate the sensitive components of the VBA. A VBA of this disclosure may attain mechanical isolation with a lower cost and complexity when compared to other techniques of VBA fabrication using a MEMS process.

In one example, the disclosure is directed to a device comprising: a translational proof mass; a support base defining a first plane; an anchor connection structure mechanically connected to the support base with an anchor, wherein the anchor connection structure is in a second plane parallel to the first plane; a lever arm mechanically connected to the anchor connection structure at a fulcrum of the lever arm, wherein a first end of the lever arm is mechanically connected to the translational proof mass, and wherein the lever arm is in the second plane; a resonator configured to: connect a second end of the lever arm to the anchor; receive a force from the lever arm when the translational proof mass is accelerated; and flex in the second plane based on the received force, wherein the resonator resonates at a driven resonant frequency and the received force from the lever arm causes a change in frequency of the resonator; wherein the translational proof mass, the lever arm and the resonator are in the second plane.

In another example, the disclosure is directed to a system comprising: a translational vibrating beam accelerometer (VBA), comprising: a translational proof mass; a support base defining a first plane; an anchor connection structure mechanically connected to the support base with an anchor, wherein the anchor connection structure is in a second plane parallel to the first plane; a lever arm mechanically connected to the anchor connection structure at a fulcrum of the lever arm, wherein a first end of the lever arm is mechanically connected to the translational proof mass, and wherein the lever arm is in the second plane; a resonator configured to: connect a second end of the lever arm to the anchor; receive a force from the lever arm when the translational proof mass is accelerated; and flex in the second plane based on the received force, wherein the resonator resonates at a driven resonant frequency and the received force from the lever arm causes a change in frequency of the resonator; wherein the translational proof mass, the lever arm and the resonator are in the second plane; a signal generation circuit operatively connected to the translational VBA; processing circuitry operatively connected to the translational VBA and the signal generation circuit, wherein: the signal generation circuit is configured to output a first signal that causes the two or more resonators of the translational VBA to vibrate at a respective resonant frequency of each of the resonators, an acceleration of the translational VBA in a direction substantially parallel to the second plane causes the first resonator and the second resonator to receive a force, such that the force causes a respective change in resonant frequency of at least one resonator of the first resonator and the second resonator, the processing circuitry is configured to receive a second signal from the translational VBA indicative of a respective change in the resonant frequency and based on the respective change in resonant frequency, determine an acceleration measurement.

In another example, the disclosure is directed to a method comprising: maintaining, by a plurality of electrodes, resonance of a first resonator and a second resonator of a translational vibrating beam accelerometer (VBA), wherein the translational VBA comprises: a translational proof mass; a support base defining a first plane; an anchor connection structure mechanically connected to the support base with an anchor, wherein the anchor connection structure is in a second plane parallel to the first plane; a lever arm mechanically connected to the anchor connection structure at a fulcrum of the lever arm, wherein a first end of the lever arm is mechanically connected to the translational proof mass, and wherein the lever arm is in the second plane; a resonator configured to: connect a second end of the lever arm to the anchor; receive a force from the lever arm when the translational proof mass is accelerated; and flex in the second plane based on the received force, wherein the resonator resonates at a driven resonant frequency and the received force from the lever arm causes a change in frequency of the resonator; wherein the translational proof mass, the lever arm and the resonator are in the second plane; receiving, by the first resonator, in response to an acceleration of the translational VBA substantially parallel to the second plane, a first force; receiving, by a second resonator, in response to the acceleration of the translational VBA substantially parallel to the second plane, a second force; detecting, by the plurality of electrodes, respective signals that are indicative of a respective change in the resonant frequency of each of the first and second resonators caused by the first force and the second force; and outputting, by the translational VBA, the respective signals.

The details of one or more examples of the disclosure are set forth in the accompanying drawings and the description below. Other features, objects, and advantages of the disclosure will be apparent from the description and drawings, and from the claims.

DETAILED DESCRIPTION

Figure 1A:
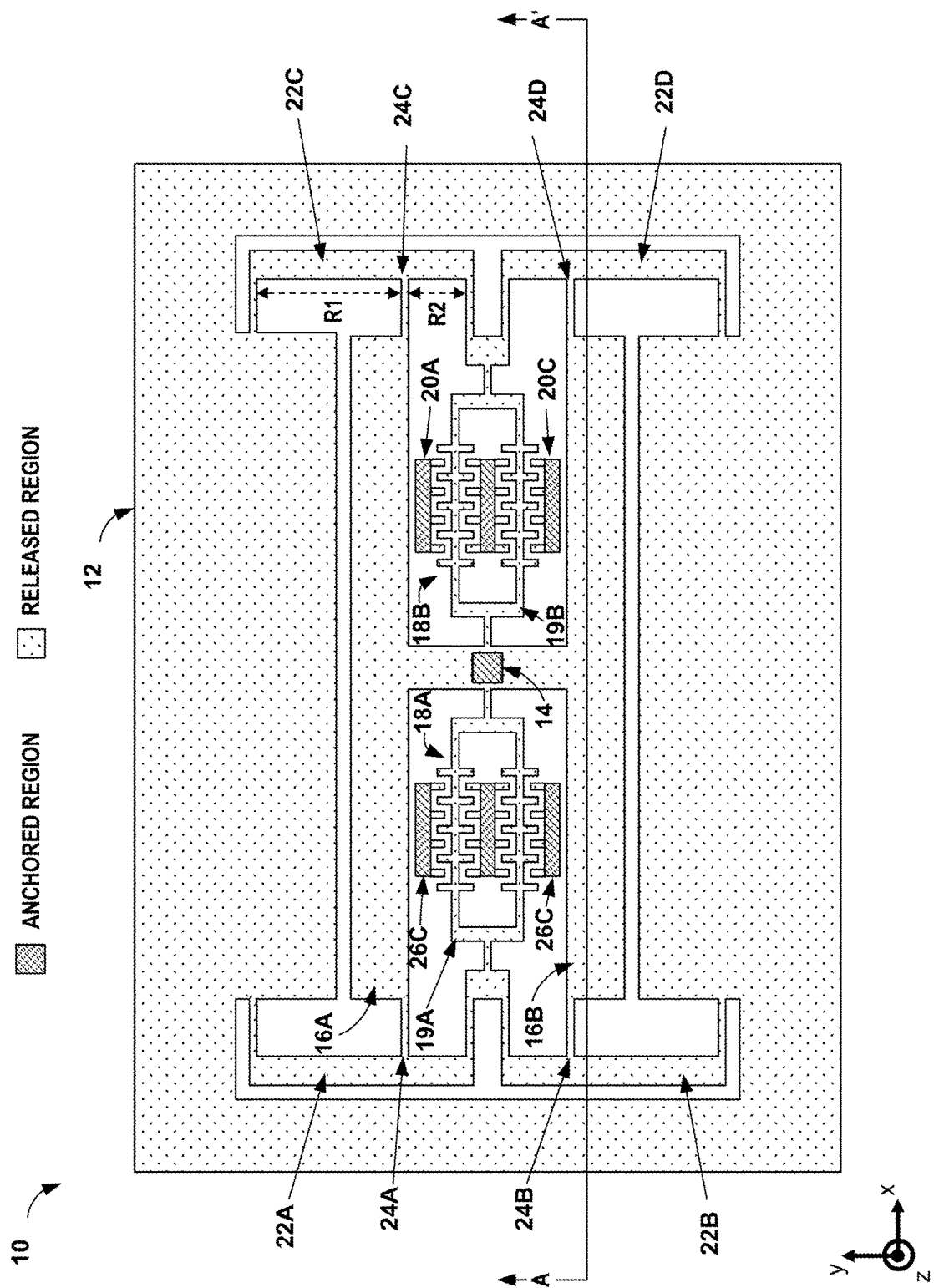
FIG. 1A is a conceptual diagram illustrating a translational VBA and an anchor connection structure according to one or more techniques of this disclosure.

The disclosure is directed to a vibrating beam accelerometer (VBA) with an in-plane translational proof mass. For example, a VBA configured in accordance with the techniques of this disclosure may include at least one or more resonators, planar geometry, discrete lever arms, four-fold symmetry and a single primary mechanical anchor between the support base and the VBA. In some examples, the VBA of this disclosure may be built according to a microelectromechanical systems (MEMS) fabrication process.

An accelerometer measures acceleration of the accelerometer device itself with respect to an inertial reference frame. Some types of VBAs may be manufactured using macro methods and may sense only out-of-plane displacement of the proof mass. VBAs using macro methods may be relatively expensive to produce and possess numerous mechanical joints between parts that may lead to performance limitations. In other examples, VBAs manufactured using MEMS manufacturing techniques may sense out-of-plane displacement of the proof mass and may require complex attachment of the resonant sensors. The VBA of this disclosure may have advantages in being less complex and in some examples may have improved performance over other types of VBA, such as improved bias repeatability with changes in operating conditions.

The translational proof mass VBA of this disclosure is configured to sense in-plane displacement of the proof mass. Some examples of in-plane type MEMS VBAs may have good scale factor stability but may lack bias stability, or more specifically, bias repeatability. The bias for an accelerometer is the offset or bias when the accelerometer is not subject to acceleration. This bias may change over different operating conditions, e.g. changes in temperature or as the accelerometer ages. The techniques of this disclosure may result in improved bias repeatability for an accelerometer over time and changing operating conditions when compared to other techniques. Bias repeatability may be equally valuable as scale factor stability for navigation-grade performance VBAs.

The geometry of a single primary mechanical anchor may minimize bias errors that can be caused by external mechanical forces applied to the circuit board, package, and/or substrate that contains the accelerometer mechanism. The source of external forces may be unavoidable, such as thermal expansion mismatch between the substrate (e.g. the support base) and the VBA mechanism. The single primary mechanical anchor of the VBA of this disclosure may mechanically isolate the sensitive components of the VBA. A VBA of this disclosure may attain mechanical isolation with a lower cost and complexity when compared to other techniques of VBA fabrication using a MEMS process.

The geometry of the VBA of this disclosure achieves mitigation of forces external to the mechanism by connecting the resonators to a rigid structure, which branches back to the primary mechanical anchor to the support base. The anchor connection structure may be sized to be have a greater stiffness than the axial spring constant of the resonators. This rigid connection effectively supports the resonators in the in-plane (e.g. x and y) directions but allows the mechanical connections of the VBA to thermally expand at a different rate and/or direction of the support base without being restrained by the support base. Fixing one end of the resonators directly to the support base may result in thermal expansion of the support base pulling directly on the resonators, which may cause unacceptable amounts of bias variation over temperature. Some example VBA configurations of this disclosure may also include supporting flexures to stiffen the structure in the out-of-plane (e.g., z) direction. These supporting flexures are designed to be substantially more flexible in the in-plane (e.g., x and y) directions.

Some example applications of the translational proof mass VBA of this disclosure may include navigation-grade MEMS accelerometer used in navigation-grade inertial measurement units (IMU's). An IMU may be used, for example, in aircraft or water borne vessels that may be subject to wind and current in addition to the forces from a propulsion unit and steering mechanisms, e.g. a rudder. An IMU that includes a VBA according to this disclosure may have an advantage of improved performance and reduced size and cost when compared to other techniques of building an IMU.

FIG. 1A is a conceptual diagram illustrating a translational VBA and an anchor connection structure according to one or more techniques of this disclosure. FIG. 1A is a top view of VBA 10 showing the anchor 14 to the support base, but the support base is not shown.

VBA 10 includes translational proof mass 12 mechanically connected to lever arms 22A-22C. Lever arms 22A-22C (collectively lever arms 22), mechanically connect to anchor connection structures 16A and 16B (collectively anchor connection structure 16), which are supported by a single primary anchor 14. Resonators 18A and 18B are mechanically connected between lever arms 22 and anchor 14. For a translational VBA according to this disclosure, translational proof mass 12 may move in a plane parallel to the plane of the support base (not shown in FIG. 1A). A support base may be a substrate of, for example, a quartz or silicon wafer. Resonators 18A and 18B of VBA 10 convert the force from movement of proof mass 12 under acceleration, to a frequency. The VBA outputs a change in the resonant frequency of each resonator as an indication of the amount of acceleration. In some examples, resonators may be located adjacent to the proof mass so that the resonators receive the proof mass force amplified through lever arms 22.

The example of FIG. 1 illustrates how translation or inertial force from proof mass 12 in the X-direction applies a force to resonators 18A and 18B in approximately the same X-direction. In other examples (not shown in FIG. 1), the lever arms and other structures of VBA 10 may be configured so that a translation or force in the X-direction from proof mass 12 may apply a force to resonators along the Y-direction, or other directions.

In one example, VBA 10 may be a MEMS VBA, which may be fabricated from a dissolved wafer process. VBA 10 may be a silicon mechanical structure tethered to lower and upper glass substrates (not shown in FIG. 1A) at specific anchor regions, e.g. anchor 14. The glass substrates may be etched in other areas to define released regions of VBA 10, which include air gaps that allow the silicon portions, such as proof mass 12, to move freely relative to X-Y plane of the substrate. Areas which are not etched may be bonded to silicon to define mechanical anchors. The geometry of both the silicon mechanism and anchor regions may be defined by photolithography.

A dissolved wafer process to fabricate a silicon VBA and glass substrates is just one example of a technique to fabricate a VBA of this disclosure. Other techniques may be used to fabricate the geometry of VBA 10. Some other examples may include materials such as quartz (SiO2), piezoelectric material and similar materials. Other processes may include isotropic etching, chemical etching, deep reactive-ion etching (DRIE) and similar processes. In the example of FIG. 1A, proof mass 12, anchor connection structure 16, lever arms 22, and resonators 18A, 18B are comprised of a monolithic material, which results in the components of VBA 10 all with the same coefficient of thermal expansion (CTE). The components of VBA 10 are all in the same plane, parallel to the X-Y plane as shown in FIG. 1A.

Resonators 18A and 18B, in the example of FIG. 1, include anchored combs and resonator beams with released combs. Resonator 18A includes resonator beam 19A with released combs and anchored combs 26A-26C and resonator 18B includes resonator beam 19B, released combs and anchored combs 20A-20C. In some examples, anchored combs may be referred to as stator combs. Resonators 18A and 18B are configured to flexibly connect the proof mass 12 to anchor connection structure 16 with resonator beams 19A and 19B and to flex within the plane of proof mass 12 based on the force applied to resonator beams 19A and 19B from lever arms 22A-22C.

Each of the two resonators 18A and 18B resonate at a respective resonant frequency, which, in some examples may be approximately the same frequency. VBA 10 includes metal layers deposited onto the glass substrates (not shown in FIG. 1A). These metal layers define electrical wires that connect silicon electrodes to bond pads. The bond pads may be external to VBA 10 and electrically connected to external circuitry that excites and sustains mechanical motion at the resonant frequency for each resonator 18A and 18B through electrostatic actuation, e.g. by applying an electric charge. In the presence of external acceleration, proof mass 12 will deflect and apply axial force to the resonator beams 19A and 19B of resonators 18A and 18B through lever arms 22. This axial force from proof mass 12 causes a change in resonant frequency from the driven frequency such that the frequency change may be used to measure external acceleration on VBA 10.

The tines of the released combs on resonator beams 19A-19B and anchored combs 20A-20C and 26A-26C may enable the detection the change in the driven resonant frequency, which may be translated as an amount of force (e.g., increase or decrease of force) and further translated as the amount of acceleration on VBA 10. For example, during calibration, the change in frequency may be mapped to a force on the resonator beam, which may be further mapped to an amount of acceleration on VBA 10. In the example of FIG. 1, the two resonators 18A and 18B allow for a differential frequency measurement results from change in frequency when a force (e.g., compression or tension) is placed on the two resonator beams 19A-19B by the movement, translation or inertial force from proof mass 12.

Resonator 18A may be configured to resonate at a different frequency than resonator 18B. The differential frequency measurement output by the sense signals from VBA 10 is used to reject sources of error common to both resonators. One example may include a temperature change. That is, a change in operating condition, such as a temperature change may affect both resonators the same way. A second example would be any shift in voltages applied to both resonators. A differential frequency measurement may subtract sources of common error applied to both resonators by subtracting the common error and leaving approximately just the signal caused by acceleration on VBA 10. The differential frequency measurement may then ultimately lead to improved bias repeatability for the accelerometer.

In the example of FIG. 1, two resonators are used to provide a differential frequency measurement. In other examples, the techniques of this disclosure may also apply to VBA's with more or fewer resonators. In other examples, the one or more resonators may be oriented at any angle, not just x and y while still using the techniques of this disclosure. Though shown as double-ended tuning fork (DETF) comb resonators in the example of FIG. 1, in other examples, resonators 18A and 18B may be configured as other types of resonators. For example, instead of DETF, resonators 18A and 18B may be single resonator beam or a more complex resonator geometry. Also, resonator beams 19A and 1B may comprise a piezoelectric material and may not include comb tines.

Anchor connection structure 16 is mechanically connected to the support base (not shown in FIG. 1A) by the single, primary anchor 14. Anchor connection structure 16, in the example of FIG. 1A includes upper and lower portions (16A, 16B) that provide a sufficiently rigid connection that allows proof mass 12 to exert axial force on the resonator beams of resonators 18A and 18B. Anchor connection structure 16 is in the same plane as proof mass 12 and resonators 18 parallel to the X-Y plane of FIG. 1A.

Anchor connection structure 16 is sized to be stiffer than the axial spring constant of resonators 18. The geometry of anchor connection structure 16 and resonators 18, according to the techniques of this disclosure, configure proof mass 12, resonator beams 19A-19B and anchor connection structure 16 to be mechanically connected to the support base by the single region at anchor 14. The geometry of the single anchor and anchor connection structure 16 may reduce or prevent bias errors that may otherwise result from the thermal expansion mismatch between the glass substrate (support base) and the silicon mechanism (e.g. proof mass 12).

Lever arms 22 mechanically connect to the anchor connection structure 16 at a fulcrum 24A-24D of the lever arms 22A. In the example of FIG. 1A, a first end of the lever arms (22A-22D) is mechanically connected to the translational proof mass 12. The resonator beams 19A and 19B flexibly connect a second end of the lever arms (22A-22D) to anchor 14. Resonators 18 connect to the second end of lever arms 22 at a distance R2 from fulcrums 24A-24D, which is the center of rotation for each of lever arms 22. The first end of lever arms 22 connect to proof mass 12 at a distance R1 from fulcrums 24A-24D. This geometry results in the inertial force of proof mass 12 on released beams 19A and 19B amplified by the leverage ratio R1/R2. Lever arms 22 rotate in the same plane as proof mass 12 and anchor connection structure 16.

The geometry of the four lever arms 22A-22D create a four-fold symmetry. In more detail, lever arm 22A is mechanically connected to the anchor connection structure 16AB at a fulcrum 24A. The first end of lever arm 22A is mechanically connected to proof mass 12, and the second end of lever arm 22A is connected to the first resonator 18A. A second lever arm 22B is mechanically connected to the anchor connection structure 16B at a fulcrum 24B. The first end of lever arm 22B is mechanically connected to the translational proof mass 12, and the second end of lever arm 22B is connected to resonator 18A.

A third lever arm 22C and fourth lever arm 22D are each mechanically connected to the anchor connection structure 16A or 16B a respective fulcrum 24C of lever arm 22C and fulcrum 24D of lever arm 22D. Each are mechanically connected to proof mass 12 at a respective first end of each of lever arm 22C and lever arm 22D. Resonator (18B) is configured to flexibly connect a respective second end of each of lever arm 22C and lever arm 22D to the anchor 14. As described above, resonator beams 19A and 19B flex in the second plane based on the translation of proof mass 12 and each resonator 18A and 18B resonates at a respective resonant frequency.

In other words, the four-fold symmetry of VBA 10 means the translational proof mass, the anchor connection structure, the first lever arm, the second lever arm, the third lever arm, the fourth lever arm form a substantially symmetrical structure. In this disclosure substantially or approximately means symmetrical or equal within manufacturing or measurement tolerances. Said another way, the anchor connection structure 16A and 16B are substantially parallel to each other and approximately equal to each other, where approximately or substantially equal means they have the same length within manufacturing or measurement tolerances. Also, the first lever arm, e.g. lever arm 22A defines a length, and the remaining lever arms 22B-22D are substantially the same length as lever arm 22A. Also, the distance between the first end of a lever arm, e.g. lever arm 22C and fulcrum 24C defines the radius R1, i.e. between the mechanical connection to proof mass 12 and fulcrum 24C. Similarly, the distance between the second end of the lever arm 22C and fulcrum 24C the radius R2. The remaining lever arms, 22A, 22B and 22D all have an R1 and R2 defined in the same manner and of approximately the same length as the R1 and R2 of lever arm 22C.

In some examples, the resonators may have a different resonant frequency, for example, because the mass of one resonator may be different from one or more other resonators. A VBA with resonators that have a different resonant frequency may provide a benefit, for example, when the VBA is at zero g, i.e. essentially no acceleration experienced by the VBA, the resonators may not vibrate at exactly the same frequency. The different frequency at zero g causes an intentional offset in the VBA and may result to improved detectability and performance.

VBA 10 may be fabricated using silicon and substrate masks such that both the proof mass 12 and anchor connection structure 16 are primarily anchored to a single region, e.g. at anchor 14. In other words, the design of the silicon and glass masks are such that both the proof mass 12 and resonators 18A-18B are primarily anchored to a single region, e.g. at anchor 14. An advantage of the geometry of a VBA of this disclosure may include to reduce or prevent thermal expansion mismatch, as well as other forces exerted on the substrate from reaching resonators 18A-18B and significantly straining the resonator beams. Therefore, the geometry of this disclosure may have an advantage of ultimately provides a more precise measurement of external acceleration when compared to a VBA with different geometry. In other words, anchor 14 may be configured to allow a first thermal expansion of the support base, and a second thermal expansion of the monolithic material of resonators 18A-18B and anchor connection structure 16, in examples in which the first thermal expansion is different than the second thermal expansion. The geometry of anchor connection structure 16 is configured to substantially prevent other forces applied to the support base from transferring to either the translational proof mass 12 or the at least two resonators. Some examples of other forces may include forces applied to VBA 10 by the circuit board, or other structure, on which VBA 10 is mounted. The circuit board may be subjected to forces, such as squeezing or twisting that may be transferred to the components on the circuit board, including VBA 10.

A translational VBA, according to one or more techniques of this disclosure, may have advantages over other types of accelerometers because a translational VBA topology is more conducive to smaller accelerometer designs. Discrete lever arms may be beneficial for achieving a large scale-factor in a small package, such as for navigation-grade performance. These lever arms define a leverage ratio that amplifies inertial force generated by the proof mass, which may allow for high leverage ratio with smaller proof masses because the leverage ratio is independent from the size of the proof mass. Also, the device topology may enable the VBA design to achieve strong bias stability and scale factor stability without being too large or expensive. Further, accelerometers configured in accordance with techniques of this disclosure may enable the creation of accelerometers that are more accurate, have a smaller profile, may be produced at reduced cost, have high reliability, and include a digital output when compared to other types of accelerometers. The four-fold symmetry may mitigate potential error sources from misalignment and other fabrication imperfections. In other words, four-fold symmetry may achieve a superior performance, given size and cost constraints, compared to other VBA techniques.

Figure 1B:
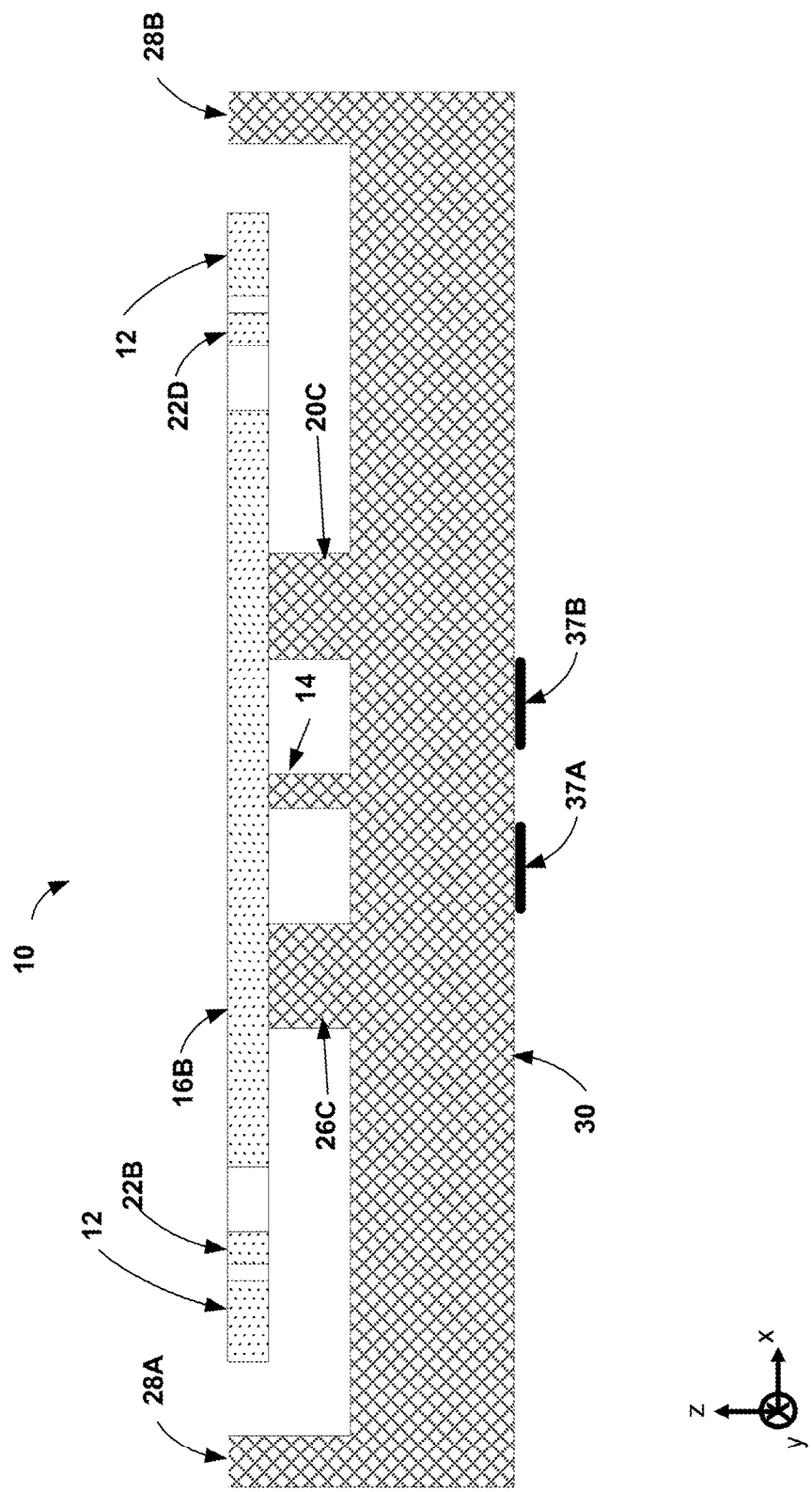
FIG. 1B is a conceptual diagram illustrating a sectional view of a translational VBA and support base.

FIG. 1B is a conceptual diagram illustrating a sectional view of a translational VBA and support base. FIG. 1B shows section A-A', which runs down the long axis of anchor connection structure 16B. Items in FIG. 1B with the same reference numbers as in FIG. 1 have the same description, properties and function as described above. For example, VBA 10 includes proof mass 12 connected to anchor connection structure 16 by lever arms 22B and 22D. FIG. 1B also shows the primary anchor 14 and the anchor portion of anchored combs 26C and 20C.

As described above in relation to FIG. 1A, VBA 10 may be fabricated using silicon and glass masks such that the proof mass 12, lever arms 22 (of which only lever arms 22B and 22D are visible in FIG. 1B) and anchor connection structure 16 (of which only the lower portion 16B is visible) are primarily anchored to a single region, e.g. at anchor 14.

The silicon mechanical structure of VBA 10 may be tethered to support base 30, which may be a glass substrate, quartz substrate or silicon substrate. The geometry of VBA 10 is configured to allow the released portions, such as proof mass 12 and the resonator beams 19A and 19B of resonators 18 (not shown in FIG. 2B) to move freely relative to the support base 30.

Support base 30 may include enclosing structures, such as structures 28A and 28B, which may surround the released portions of VBA 10. In some examples, VBA 10 may include both lower support base 30 and an upper support (not shown in FIG. 1B). In some examples the anchored portions, e.g. anchor 14, may be mechanically connected to both the lower support base 30 and the upper support. Support base 30 may define a second plane, also substantially parallel to the X-Y plane that is different from the plane of the released portions of VBA 10. The plane defined by the released portions of VBA 10 (e.g. resonator beams 19A-19B and proof mass 12) may be substantially parallel to the second plane defined by support base 30. Air gaps between the plane of the proof mass and the plane of support base 30 may allow the silicon portions, such as the proof mass, to move freely relative to the substrate in the X-Y plane.

Anchor connection structure 16B may be configured to be more rigid than the resonators. The rigid structure of resonator connection structure 16 connects to the resonators and branches back to the primary mechanical anchor 14, which is connected to support base 30. Anchor connection structure 16B, as described above, may be sized to be stiffer than the axial spring constant of the resonators and supports the resonators in the in-plane (e.g. x and y) directions. In some examples, anchor connection structure 16 may be an order of magnitude stiffer than resonator beams 19A-19B. The single primary anchor 14 allows the mechanical connections of the released portions of VBA 10 to thermally expand at a different rate or direction of the support base 30 without being restrained by other connections to support base 30 that may cause bias and inaccuracy.

Support base 30 may include metal layers deposited onto the glass substrates (not shown in FIG. 1B), which define electrical wires that connect silicon electrodes to wire bond pads. In some examples, support base 30 may include bond pads and other metal structures on the bottom surface of support base 30 (e.g. as indicated by the arrow from 30), such as conductive paths 37A and 37B. In some examples, support base 30 may include metal layers on the top surface, e.g. on the surface opposite the bottom surface, and in other examples, support base 30 may include intermediate metal layers between the top and bottom surfaces (not shown in FIG. 1B). In some examples the metal layers may electrically connect to each other with vias, or other types of connections through support base 30. In some examples, electrical wires may also be defined with other conductive material other than metal. As described above in relation to FIG. 1A, the metal layers, or other conductive material, may define electrical paths to carry signals to and from VBA 10, such as via conductive paths 37A and 37B.

As described above in relation to FIG. 1A, each resonator of the one or more resonators may include a resonator beam (e.g. 19A) with released combs and an anchored comb (e.g. 20C and 26C). As shown in FIG. 1B, the anchor portion anchored combs 20C and 26C extend from the plane of support base 30 to the plane of the released portions of VBA 10. The comb portions of anchored combs 20C and 26C are supported in the same plane as resonator beams 19A-19B and proof mass 12 and 32, described above in relation to FIG. 1A.

Figure 2A:
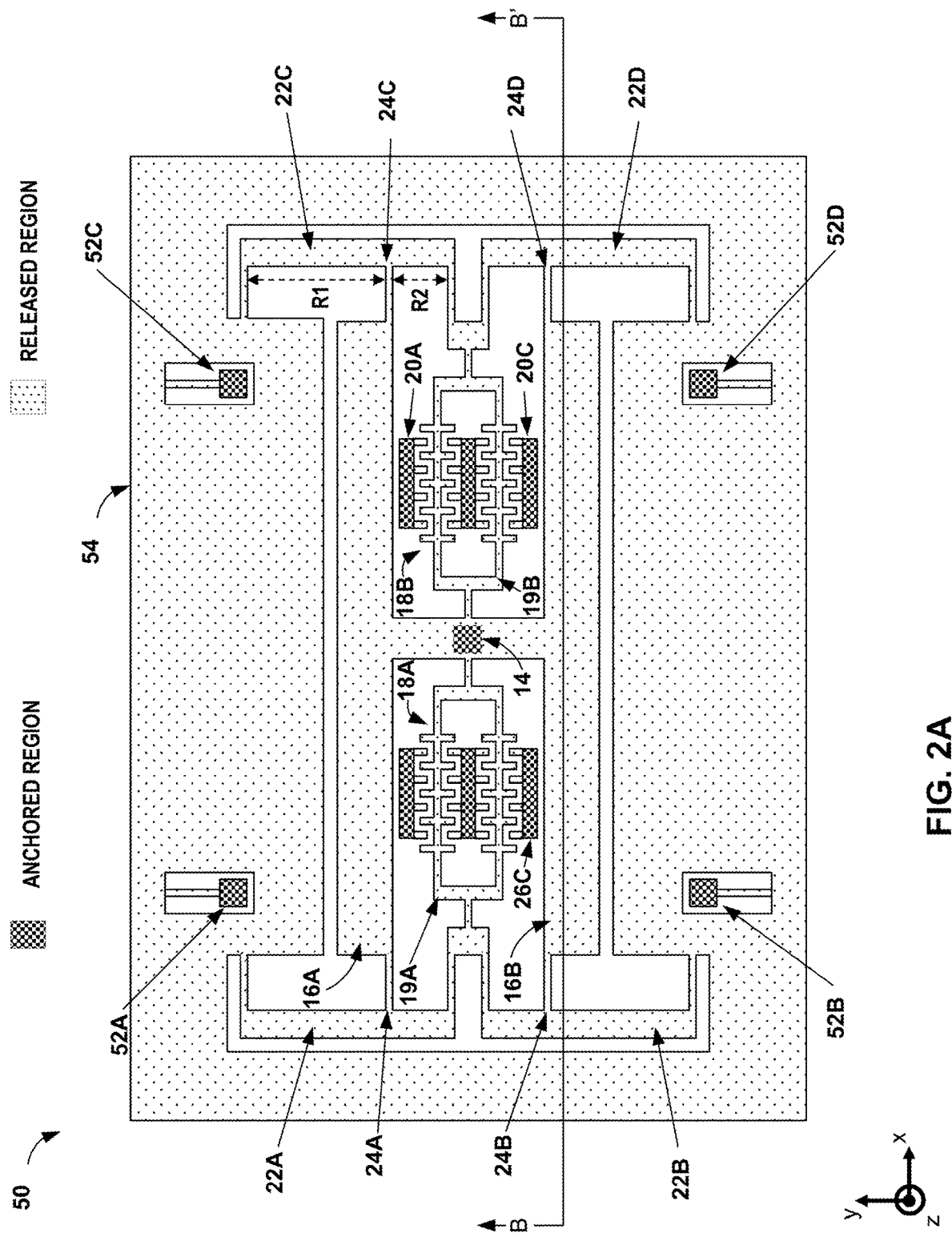
FIG. 2A is a is a conceptual diagram illustrating a translational VBA with support flexures and an anchor connection structure according to one or more techniques of this disclosure.

FIG. 2A is a is a conceptual diagram illustrating a translational VBA with support flexures and an anchor connection structure according to one or more techniques of this disclosure. Similar to FIG. 1A, FIG. 2A is a top view of VBA 50 showing the anchor 14 to the support base, but the support base is not shown. Items in FIG. 2A with the same reference numbers as in FIGS. 1A and 1B have the same description, properties and function as described above in relation to FIGS. 1A and 1B. FIG. 2A also shows section B-B', which runs along the long axis of anchor connection structure 16B.

Translational proof mass 54 includes supporting flexures, but otherwise the functions and description of proof mass 54 is the same as proof mass 12 described above in relation to FIGS. 1A and 1B. As with VBA 10 described above, VBA 50 includes translational proof mass 54 mechanically connected to lever arms 22A-22C. Lever arms 22 mechanically connect to anchor connection structure 16, which includes upper and lower portions 16A and 16B. Anchor connection structure 16 is supported by single primary anchor 14. Resonators 18A and 18B are mechanically connected between lever arms 22 and anchor 14 to proof mass 54.

Support flexures 52A-52D on proof mass 54 may stiffen movement of proof mass 54 in the out-of-plane (z) direction. In other words, support flexures 52A-52D are configured to restrict out-of-plane motion of proof mass 54 with respect to the X-Y plane parallel to the proof mass 54 and anchor connection structure 16. Flexures 52A-52D are configured to be substantially more flexible in the in-plane (x and y) directions than the rigid anchor connection structure or the axial stiffness of the resonators to have little or no impact on in-plane movement of proof mass 54. Flexures 52A-52D includes an anchor portion, connected to the support base (not shown in FIG. 2A) similar to primary anchor 14. Flexures 52A-52D may include a flexible portion connected between the anchor portion and proof mass 54. The flexible portion of flexure 33 may be of the same or similar material to that of proof mass 54. The configuration of the one or more support flexures may reduce out of plane movement, while avoiding bias caused by forces applied to the accelerometer mechanism (e.g. proof mass 54 and resonators 18A and 18B) that may be caused by CTE mismatch between the substrate and the accelerometer mechanism. In other words, in some examples, the CTE for each of the translational proof mass 54, the anchor connection structure 16, resonators 18 and mechanical connections between proof mass 54, the anchor connection structure 16, resonators 18 and lever arms 22 are substantially equal.

The position of the anchor portions and the shape and configuration of the flexible portions of flexures 52A-52D shown in FIG. 2A is just one example technique for providing support flexures to stiffen movement of proof mass 54 in the out-of-plane (z) direction. In other examples, the flexible portions of flexures 52A-52D may have different shapes, such as an angled beam or an S-shape. In other examples, VBA 50 may include more or fewer support flexures. The anchor portions of support flexures of this disclosure will not exert significant forces on proof mass 54, so the accelerometer mechanism of VBA 50 will still be connected to the structure of the support base primarily by a single anchor region, e.g. anchor 14. As with VBA 10 described above in relation to FIG. 1A, advantages of the geometry of VBA 50 include reduced bias errors that may otherwise result from the thermal expansion mismatch between the glass substrate (support base) and the silicon mechanism (e.g. proof mass 54). Another advantage may include reduced cost and complexity, by achieving the mechanical isolation within the MEMS mechanism, which may avoid the need for additional manufacturing steps or components, such as discrete isolation stages.

Figure 2B:
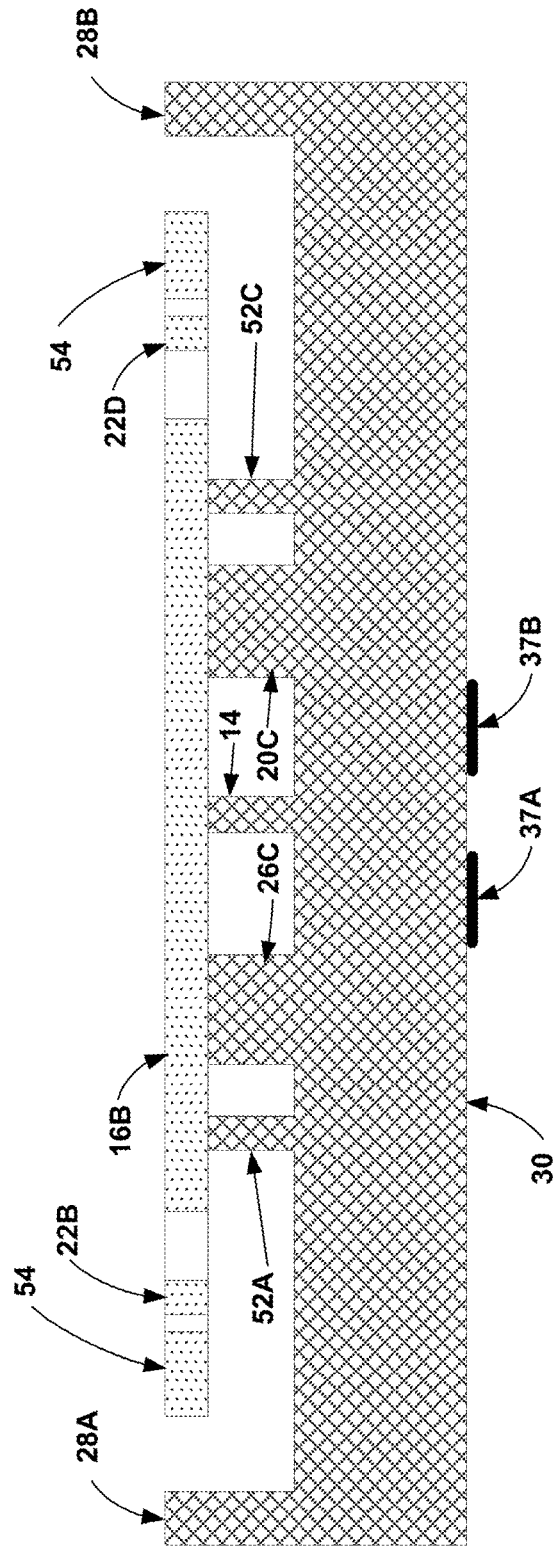
FIG. 2B is a conceptual diagram illustrating a sectional view of a translational VBA with support flexures and support base.

FIG. 2B is a conceptual diagram illustrating a sectional view of a translational VBA with support flexures and support base. FIG. 2B shows section B-B', which runs down the long axis of anchor connection structure 16B. Items in FIG. 2B with the same reference numbers as in FIGS. 1A-2A have the same description, properties and function as described above. For example, FIG. 2B shows VBA 50 including proof mass 54 connected to anchor connection structure 16 by lever arms 22B and 22D. FIG. 2B also shows the primary anchor 14, the anchor portion of anchored combs 26C and 20C, and the anchored portions of support flexures 52A and 52C.

As described above in relation to FIG. 1A, VBA 50 may be fabricated using silicon and glass masks such that the proof mass 54, lever arms 22 (of which only lever arms 22B and 22D are visible in FIG. 2B) and anchor connection structure 16 (of which only the lower portion 16B is visible) are primarily anchored to a single region, e.g. at anchor 14. The silicon mechanical structure of VBA 10 may also be tethered to support base 30 by support flexures, such as flexures 52A and 52C. As described above in relation to FIGS. 1A-2A, the geometry and air gaps of VBA 50 is configured to allow the released portions, e.g. proof mass 54 and the resonator beams 19A and 19B of resonators 18 (not shown in FIG. 2B) to move freely relative to the support base 30 in the X-Y plane but restrict motion in the Z-direction.

As described above in relation to FIG. 1B, support base 30 may include enclosing structures, such as structures 28A and 28B, which may surround the released portions of VBA 50. In some examples, VBA 50 may include both lower support base 30 and an upper support (not shown in FIG. 2B). Similar to FIG. 1B, support base 30 may define a plane substantially parallel to the X-Y plane different from the plane defined by the released portions of VBA 50. Support base 30 may also include the metal layers, or other conductive material, that define electrical paths to carry signals to and from VBA 50, such as via conductive paths 37A and 37B.

Figure 3:
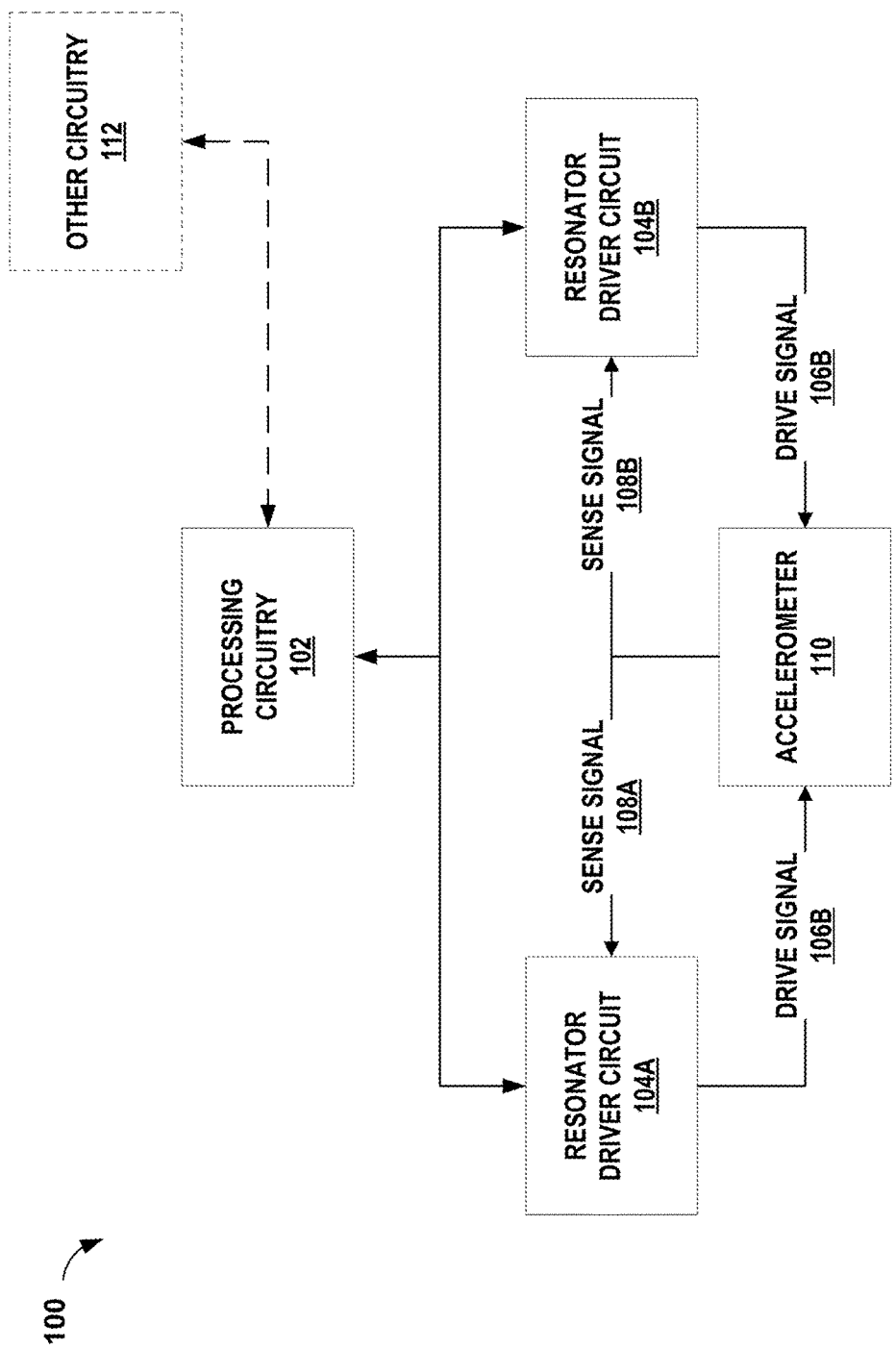
FIG. 3 is a functional block diagram illustrating a system including a translational VBA according to one or more techniques of this disclosure.

FIG. 3 is a functional block diagram illustrating a system including a VBA according to one or more techniques of this disclosure. The functional blocks of system 100 are just one example of a system that may include a VBA according to this disclosure. In other examples, functional blocks may be combined, or functions may be grouped in a different manner than depicted in FIG. 3. Other circuitry 112 may include power supply circuits and other processing circuits that may use the output of accelerometer 110 to perform various functions, e.g. inertial navigation and motion sensing.

System 100 may include processing circuitry 102, resonator driver circuits 104A and 104B, and accelerometer 110. Accelerometer 110 may include any VBA, including the translational VBA accelerometers described above in relation to FIGS. 1-2B.

In the example of FIG. 3, resonator driver circuits 104A and 104B are operatively connected to accelerometer 110 and may send drive signals 106A and 106B to accelerometer 110 as well as receive sense signals 108A and 108B from accelerometer 110. In the example of FIG. 3, resonator driver circuit 104A may be coupled to one resonator, e.g. resonator 18A depicted in FIG. 2A, and resonator driver circuit 104B may be coupled to a second resonator, e.g. resonator 18B. Resonator driver circuits 104A and 104B may be configured to output a signal that causes the resonators of accelerometer 110 to vibrate at a respective resonant frequency of each of the resonators. In some examples, vibrate means to excite and sustain mechanical motion for each resonator through electrostatic actuation. In some examples, resonator driver circuits 104A and 104B may include one or more oscillator circuits. In some examples the signal to accelerometer 110 may travel along conductive pathways along or within the support base of accelerometer, such as support base 30 described above in relation to FIGS. 1B and 2B. The signal from resonator driver circuits 104A and 104B may provide a patterned electric field to cause resonators of accelerometer 110 to maintain resonance.

Resonator driver circuit 104A may output drive signal 106A at a different frequency than drive signal 106B from resonator driver circuit 104B. The example of FIG. 3 may be configured to determine a differential frequency signal based on sense signals 108A and 108B. Resonator driver circuits 104A and 104B may adjust the output of drive signals 106A and 106B based on the feedback loop from sense signals 108A and 108B, e.g. to maintain the resonators at the respective resonant frequency. As described above, a VBA according to this disclosure may include one resonator or more than two resonators and may also include fewer or additional resonator driver circuits.

Processing circuitry 102 may communicate with resonator driver circuits 104A and 104B. Processing circuitry 102 may include various signal processing functions, such as filtering, amplification and analog-to-digital conversion (ADC). Filtering functions may include high-pass, band-pass, or other types of signal filtering. In some examples, resonator driver circuits 104A and 104B may also include signal processing functions, such as amplification and filtering. Processing circuitry 102 may output the processed signal received from accelerometer 110 to other circuitry 112 as an analog or digital signal. Processing circuitry 102 may also receive signals from other circuitry 112, such as command signals, calibration signals and similar signals.

Processing circuitry 102 may operatively connect to accelerometer 110, e.g. via resonator drive circuits 104A and 104B. Processing circuitry 102 may be configured to receive the signal from accelerometer 110, which may indicate of a respective change in the resonant frequency of at least one resonator of accelerometer 110. Based on the respective change in resonant frequency, processing circuitry 102 may determine an acceleration measurement. In other examples (not shown in FIG. 3), processing circuitry 102 may be part of the feedback loop from accelerometer 110 and may control drive signals 106A and 106B to maintain the resonators at their resonant frequency.

Figure 4:
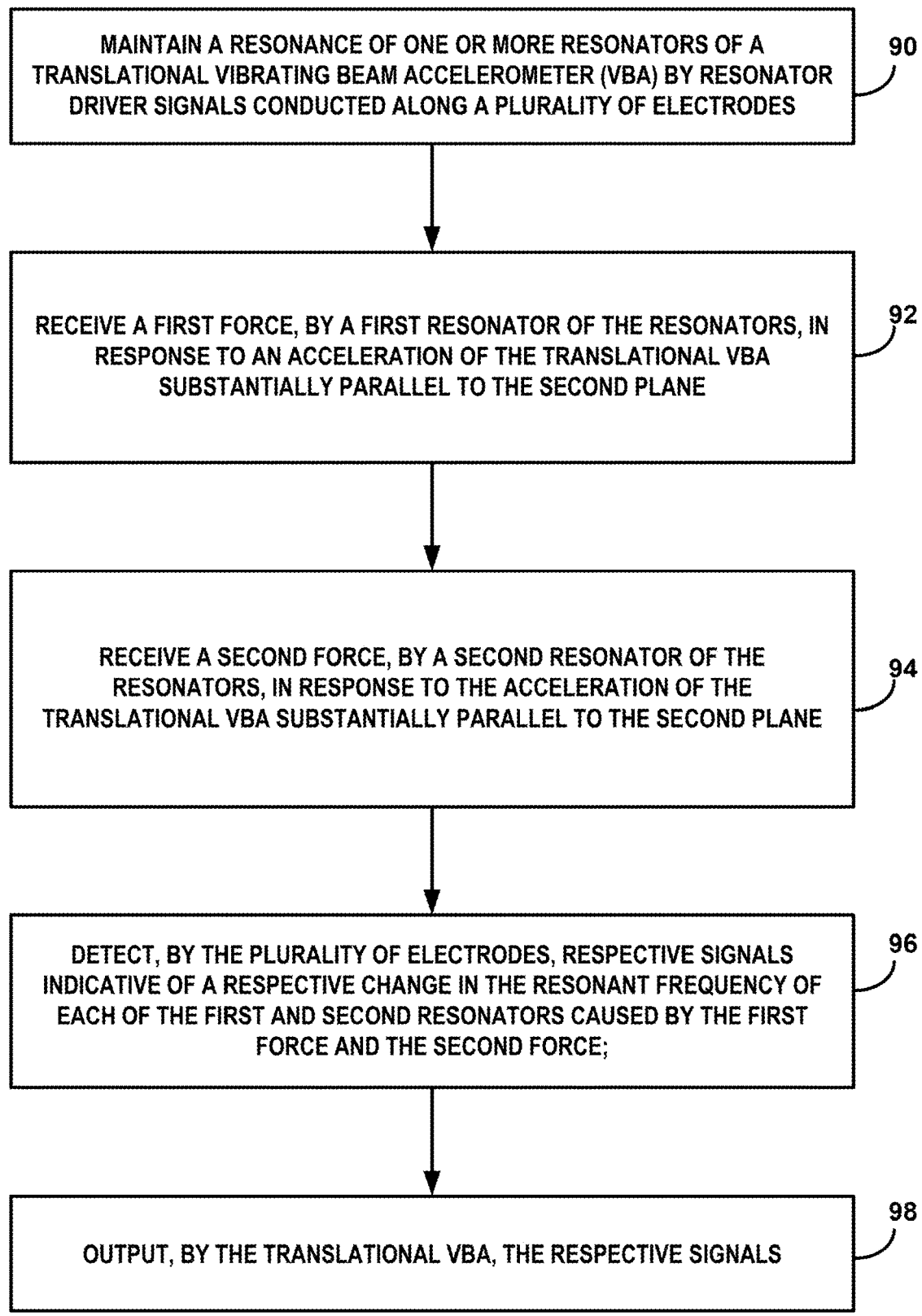
FIG. 4 is a flow diagram illustrating an example mode of operation of a VBA according to one or more techniques of this disclosure.

FIG. 4 is a flow diagram illustrating an example mode of operation of a VBA according to one or more techniques of this disclosure. The steps of FIG. 4 will be described in terms of FIGS. 2A and 2B unless otherwise noted.

A VBA, such as VBA 50, may receive electrical signals that maintain a resonance of one or more resonators, such as resonators 18A and 18B. The electrical signals may travel along a plurality of electrodes, or other conductive pathways of VBA 50, such as conductive pathways 37A and 37B (90). In some examples the electrical signals may be received by VBA 50 from a resonator driver circuit, such as resonator driver circuits 104A and 104B described above in relation to FIG. 3.

In response to an acceleration on VBA 50, proof mass 54 may move in the X-Y plane, causing lever arms 22 to apply a force to the released beams 19A and 19B of resonators 18 (92). In some examples, the acceleration of VBA 50 may be substantially parallel to the X-Y plane.

In response to an acceleration on VBA 50, proof mass 54 may apply an inertial force to lever arms 22 along the X-Y plane. In some examples the acceleration of VBA 50 may be substantially parallel to the X-Y plane. Lever arms 22 may apply a force to a resonator, such as resonator 18A (92).

The movement of proof mass 54 may also apply a force to a second resonator, such as resonator 18B (94). In the example of FIGS. 2A and 2B, with two resonators configured on each side of anchor 14, the first force, e.g. on resonator 18A may be a compressive force and the second force, e.g. on resonator 18B may be a tension force.

The plurality of electrodes in VBA 50 may detect respective signals from resonators 18A and 18B that are indicative of a respective change in the resonant frequency of each resonator, which was caused by the forces on resonator beams 19A and 19B of resonators 18A and 18B (96). VBA 50 may output the respective signals indicating the change in frequency, e.g. via conductive paths in support base 30, such as conductive paths 37A and 37B (98).

In one or more examples, the functions described above may be implemented in hardware, software, firmware, or any combination thereof. For example, the various components of FIG. 4, such as processing circuitry 102, signal processing circuit 106 and signal generation circuit 104 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, as used in this disclosure, computer-readable media generally may correspond to any tangible computer-readable storage media which is non-transitory. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media, such as memory 332, can comprise RAM, ROM, EEPROM, or other magnetic storage devices, flash memory, or any other medium that can be used to store desired program code in the form of instructions or data structures and that can be accessed by a computer. For example, processing circuitry 102 may include a microcontroller, which may contain one or more memory storage portions.

Instructions may be executed by one or more processors, such as one or more DSPs, general purpose microprocessors, ASICs, FPGAs, or other equivalent integrated or discrete logic circuitry. Accordingly, the term "processor," as used herein, such as processing circuitry 102, may refer to any of the foregoing structure or any other structure suitable for implementation of the techniques described herein. In addition, in some aspects, the functionality described herein may be provided within dedicated hardware and/or software modules configured for encoding and decoding. Also, the techniques could be fully implemented in one or more circuits or logic elements.

The techniques of this disclosure may be implemented in a wide variety of devices or apparatuses, including an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples of the disclosure have been described. These and other examples are within the scope of the following claims.

The invention claimed is:

1. A device comprising:
a translational proof mass;
a support base defining a first plane;
an anchor connection structure mechanically connected to the support base with an anchor, wherein the anchor connection structure is in a second plane parallel to the first plane;
a lever arm mechanically connected to the anchor connection structure at a fulcrum of the lever arm,
wherein a first end of the lever arm is mechanically connected to the translational proof mass, and
wherein the lever arm is in the second plane;
a resonator configured to:
connect a second end of the lever arm to the anchor;
receive a force from the lever arm when the translational proof mass is accelerated; and
flex in the second plane based on the received force, wherein the resonator resonates at a driven resonant frequency and the force from the lever arm causes a change in frequency of the resonator;
wherein the translational proof mass, the lever arm and the resonator are in the second plane.

2. The device of claim 1, wherein the resonator is a first resonator, the lever arm is a first lever arm and the resonant frequency is a first resonant frequency, the device further comprising a second resonator and a second lever arm, a third lever arm and a fourth lever arm, wherein:
the second lever arm is mechanically connected to the anchor connection structure at a fulcrum of the second lever arm,
wherein a first end of the second lever arm is mechanically connected to the translational proof mass, and a second end of the second lever arm is connected to the first resonator;
the third lever arm and the fourth lever arm:
are each mechanically connected to the anchor connection structure a respective fulcrum of each of the third lever arm and the fourth lever arm; and
are each mechanically connected to the translational proof mass at a respective first end of each of the third lever arm and the fourth lever arm;
the second resonator is configured to:
connect a respective second end of each of the third lever arm and the fourth lever arm to the anchor; and
flex in the second plane based on the translation of the translational proof mass, wherein the second resonator resonates at a second resonant frequency, wherein the second lever arm, the third lever arm, the fourth lever arm, and the second resonator are in the second plane.

3. The device of claim 2, further comprising a support flexure coupled to the translational proof mass, wherein the support flexure is configured to restrict out-of-plane motion of the translational proof mass with respect to the second plane.

4. The device of claim 2, wherein the first resonator and the second resonator each comprise at least one an anchored comb and at least one released comb, wherein:
the anchored comb is in the second plane and mechanically attached to the support base in the first plane,
a released beam of the first resonator is in the second plane and mechanically attached to the anchor connection structure and mechanically attached to the second end of the first lever arm and the second end of the second lever arm, and
a released beam of the second resonator is in the second plane and mechanically attached to the anchor connection structure and mechanically attached to the second end of the third lever arm and the second end of the fourth lever arm.

5. The device of claim 2, wherein the translational proof mass, the anchor connection structure, the first lever arm, the second lever arm, the third lever arm, the fourth lever arm form a substantially symmetrical structure.

6. The device of claim 5, wherein the substantially symmetrical structure comprises:
the first lever arm defines a length, and wherein the second lever arm, the third lever arm, the fourth lever arm are substantially the same length as the first lever arm;
a distance between the first end of the first lever arm and the fulcrum of the first lever arm defines a first radius and a distance between the second end of the first lever arm and the fulcrum of the first lever arm defines a second radius,
wherein the second lever arm, the third lever arm, the fourth lever arm each comprise a respective first radius and a respective second radius,
wherein the respective first radius of the second lever arm, the third lever arm, the fourth lever arm are each substantially equal to the first radius of the first lever arm, and
wherein the respective second radius of the second lever arm, the third lever arm, the fourth lever arm are each substantially equal to the second radius of the first lever arm.

7. The device of claim 2, wherein the anchor connection structure comprises a stiffness greater than an axial spring constant of each resonator of the first resonator and the second resonator.

8. The device of claim 2, wherein the anchor is configured to allow a first thermal expansion of the support base, and a second thermal expansion of the first resonator, the second resonator and the anchor connection structure, wherein the first thermal expansion is different than the second thermal expansion.

9. The device of claim 7, wherein the anchor connection structure is configured such that the anchor connection structure prevents bias errors from a thermal expansion mismatch between the support base and the translational proof mass, the first resonator and the second resonator.

10. The device of claim 7, wherein a coefficient of thermal expansion for each of the translational proof mass, the anchor connection structure, the first resonator and the second resonator, lever arms and mechanical connections between the translational proof mass, the anchor connection structure, the first resonator and the second resonator, and the lever arms are substantially equal.

11. The device of claim 2, wherein the anchor connection structure is configured to substantially prevent a force applied to the support base transferring to either the translational proof mass or to the first resonator and the second resonator.

12. The device of claim 11, wherein force applied to the support base is a twisting force.

13. The device of claim 2, wherein the first resonator receives a tension force while the second resonator receives a compression force.

14. The device of claim 2, wherein the first resonator and the second resonator provide a differential frequency measurement.

15. A system comprising
a translational vibrating beam accelerometer (VBA), comprising:
a translational proof mass;
a support base defining a first plane;
an anchor connection structure mechanically connected to the support base with an anchor, wherein the anchor connection structure is in a second plane parallel to the first plane;
a lever arm mechanically connected to the anchor connection structure at a fulcrum of the lever arm, wherein a first end of the lever arm is mechanically connected to the translational proof mass, and wherein the lever arm is in the second plane;
two or more resonators, including a first resonator and a second resonator, wherein the first resonator is configured to:
connect a second end of the lever arm to the anchor;
receive a force from the lever arm when the translational proof mass is accelerated; and
flex in the second plane based on the received force, wherein the first resonator resonates at a driven resonant frequency and the received force from the lever arm causes a change in frequency of the first resonator;
wherein the translational proof mass, the lever arm and the first resonator are in the second plane;
a signal generation circuit operatively connected to the translational VBA;
processing circuitry operatively connected to the translational VBA and the signal generation circuit,
wherein:
the signal generation circuit is configured to output a first signal that causes the two or more resonators of the translational VBA to vibrate at a respective resonant frequency of each of the resonators,
an acceleration of the translational VBA in a direction substantially parallel to the second plane causes the first resonator and the second resonator to receive a force, such that the force causes a respective change in resonant frequency of at least one resonator of the first resonator and the second resonator,
the processing circuitry is configured to receive a second signal from the translational VBA indicative of a respective change in the resonant frequency and based on the respective change in resonant frequency, determine an acceleration measurement.

16. The system of claim 15, wherein the first signal from the signal generation circuit is configured to vibrate each of the first resonator and the second resonator, wherein vibrate comprises excite and sustain mechanical motion for each resonator through electrostatic actuation.

17. A method comprising:
  maintaining, by a plurality of electrodes, resonance of a first resonator and a second resonator of a translational vibrating beam accelerometer (VBA), wherein the translational VBA comprises:
    a translational proof mass;
    a support base defining a first plane;
    an anchor connection structure mechanically connected to the support base with an anchor, wherein the anchor connection structure is in a second plane parallel to the first plane;
    a lever arm mechanically connected to the anchor connection structure at a fulcrum of the lever arm, wherein a first end of the lever arm is mechanically connected to the translational proof mass, and wherein the lever arm is in the second plane;
    the first resonator is configured to:
      connect a second end of the lever arm to the anchor;
      receive a force from the lever arm when the translational proof mass is accelerated; and
      flex in the second plane based on the received force, wherein the first resonator resonates at a driven resonant frequency and the received force from the lever arm causes a change in frequency of the first resonator;
    wherein the translational proof mass, the lever arm and the first resonator are in the second plane;
  receiving, by the first resonator, in response to an acceleration of the translational VBA substantially parallel to the second plane, a first force;
  receiving, by the second resonator, in response to the acceleration of the translational VBA substantially parallel to the second plane, a second force;
  detecting, by the plurality of electrodes, respective signals that are indicative of a respective change in the resonant frequency of each of the first resonator and the second resonator caused by the first force and the second force; and
  outputting, by the translational VBA, the respective signals.

18. The method of claim 17, wherein a material of the first resonator and the second resonator is at least one of a piezoelectric material or a silicon material.

19. The method of claim 17, wherein maintaining the resonance of the first resonator and the second resonator of the translational VBA comprises receiving, by the translational VBA and from an oscillator circuit coupled to the plurality of electrodes, an electric charge such that the first resonator and the second resonator vibrate at the resonant frequency of each of the first resonator and the second resonator.

20. The method of claim 17, wherein outputting the respective signals comprises outputting, via at least one oscillator circuit of the accelerometer, the respective signals to a processing circuitry, the method further comprising determining, by the processing circuitry and based on the respective signals, an acceleration measurement.

* * * * *